US007126397B1

(12) United States Patent
Mok

(10) Patent No.: US 7,126,397 B1
(45) Date of Patent: Oct. 24, 2006

(54) PULSE WIDTH MODULATION CARRIER FREQUENCY TECHNIQUE

(75) Inventor: Stephanie Z. Mok, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 22 days.

(21) Appl. No.: 11/026,713

(22) Filed: Dec. 30, 2004

(51) Int. Cl.
*H03K 3/017* (2006.01)
(52) U.S. Cl. ...................................... 327/175; 327/172
(58) Field of Classification Search ......... 327/172–175
See application file for complete search history.

(56) References Cited

U.S. PATENT DOCUMENTS

| 6,819,154 | B1 * | 11/2004 | Greenfeld ................... 327/172 |
| 6,828,836 | B1 * | 12/2004 | Barrow et al. .............. 327/172 |
| 6,853,227 | B1 * | 2/2005 | Laletin ........................ 327/175 |
| 6,897,698 | B1 * | 5/2005 | Gheorghiu et al. ......... 327/231 |

* cited by examiner

*Primary Examiner*—Dinh T. Le

(57) ABSTRACT

A PWM method and circuit. A temporary PWM signal is generated at a first frequency. The temporary PWM signal includes analog duty cycle information adapted for the first frequency. At least a portion of the analog duty cycle information is converted to digital duty cycle information adapted for a second frequency. A final PWM signal having a carrier frequency of the second frequency is generated from the digital duty cycle information.

32 Claims, 8 Drawing Sheets

US 7,126,397 B1

PULSE WIDTH MODULATION CARRIER FREQUENCY TECHNIQUE

TECHNICAL FIELD

Embodiments of the present invention generally pertain to the field of electronic circuits. More particularly, embodiments of the present invention are related to techniques for controlling the carrier frequency of a pulse width modulated signal.

BACKGROUND ART

Many integrated circuit applications require a pulse width modulated (PWM) signal. FIG. 1A illustrates a conventional circuit 100 for generating a PWM signal from a ramp voltage reference and an input signal. The widths of respective pulses in the PWM signal are modulated based on the input signal. The PWM signal has a carrier frequency "$f_{ref}$" that is the same frequency as the ramp voltage reference. The duty cycle of each period of the PWM signal depends upon the relative magnitudes of the ramped reference signal and the input signal. Thus, the duty cycle of the PWM signal contains information about the magnitude of the input signal.

FIG. 1B illustrates a conventional circuit 150 for generating a ramped reference voltage, which may be used to create the PWM signal having the same frequency "$f_{ref}$" as the ramped reference voltage signal. The ramped voltage circuit 150 functions by charging the capacitor $C_{ref}$ with the bias current $I_{bias}$ until the capacitor $C_{ref}$ is at the reference voltage $V_{Dc\_ref}$. During this period, the output voltage ramps up. When the output voltage reaches the reference voltage, the capacitor $C_{ref}$ rapidly discharges to create the saw-tooth waveform of the output ramped reference voltage.

SUMMARY

The present invention provides a method and circuit that generate a PWM signal at a desired carrier frequency. Embodiments of the present invention generate a low carrier frequency PWM signal. Embodiments of the present invention do not require a large on-chip capacitor for generation of a low carrier frequency PWM signal. Embodiments of the present invention provide a low carrier frequency PWM signal generation circuit that is compatible with and can be fabricated economically with existing semiconductor fabrication techniques.

A method and circuit for generating a PWM signal is disclosed. In one embodiment, a temporary PWM signal is generated at a first frequency. The temporary PWM signal includes analog duty cycle information adapted for the first frequency. At least a portion of the analog duty cycle information is converted to digital duty cycle information adapted for a second frequency. A final PWM signal having a carrier frequency of the second frequency is generated from the digital duty cycle information.

Another embodiment in accordance with the present invention is a circuit for generating a pulse-width modulated signal. The circuit includes temporary pulse-width modulated (PWM) generation logic that generates a temporary pulse-width modulated (PWM) signal comprising analog duty cycle information. The circuit further includes conversion logic that converts at least a portion of the analog duty cycle information to digital duty cycle information adapted for a second frequency. The circuit also has final PWM generation logic that generates a final PWM signal from the digital duty cycle information adapted for the second frequency. The final PWM has a carrier frequency of the second frequency.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, pulse width modulated signal generation, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

In some applications, it is desirable for a PWM signal to have a low carrier frequency. Moreover, it is desirable for the carrier frequency of the PWM signal to be programmable. However, conventional techniques for generating a low-frequency PWM signal typically require a very large capacitor. Unfortunately, a large capacitor requires considerable die area. While the capacitor could be located externally, this solution undesirably requires an additional pin.

Thus, a need exists for a low carrier frequency PWM signal generator. A further need exists for programming the carrier frequency of the PWM output signal. A still further need exists for low carrier frequency PWM generation that does not require a large capacitor. A further need exists for a low carrier frequency PWM circuit that is compatible with and can be fabricated economically with existing semiconductor fabrication techniques.

Embodiments of the present invention provide methods and circuits that are able to generate a low carrier frequency PWM generator. Embodiments of the present invention provide for programming the carrier frequency of the PWM output signal. Embodiments of the present invention do not require a large capacitor to generate a low carrier frequency PWM signal. Embodiments of the present invention are compatible with and can be fabricated economically with existing semiconductor fabrication techniques.

Figure 1A:
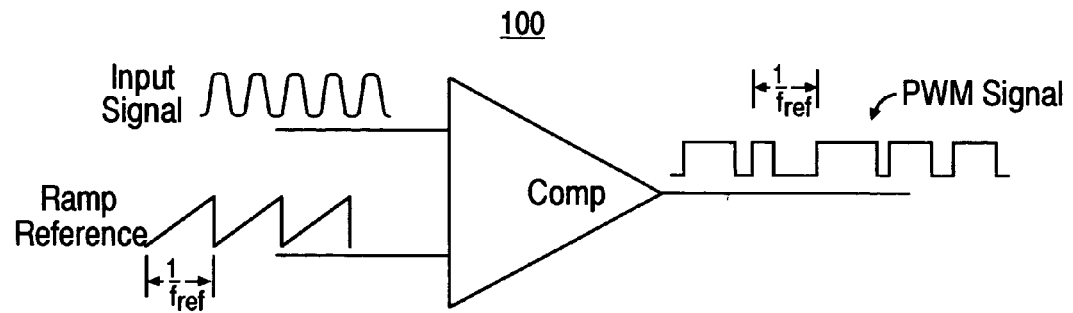
FIG. 1A is a diagram of a conventional circuit for generating a pulse width modulated signal.
Figure 1B:
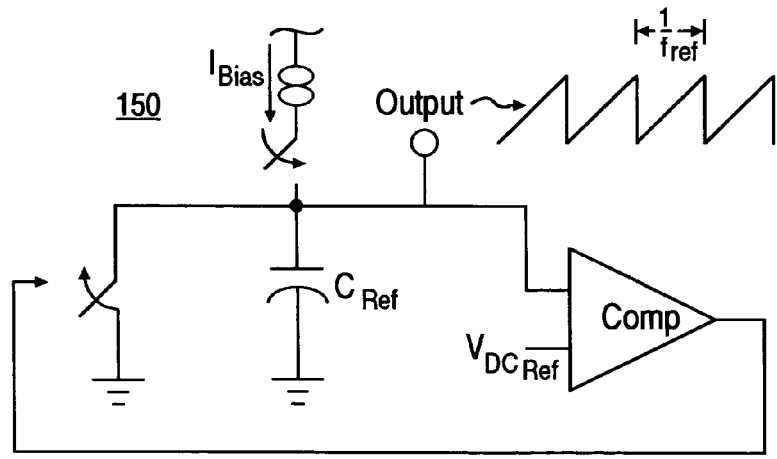
FIG. 1B is a diagram of a conventional circuit for generating a ramped voltage reference.

Referring again to FIG. 1A, the carrier frequency of the PWM signal will be equal to the frequency of the ramped voltage signal, in this circuit. Referring again to FIG. 1B, the frequency of the ramped voltage signal depends on the rate of charging the capacitor as shown in Equation 1.

$$f=I_{bias}/(C_{ref}*V_{DC-ref})$$  Equation 1

For practical reasons, the bias current $I_{bias}$ cannot be made small enough or the reference voltage $V_{DC-ref}$ large enough to create a low frequency ramped reference voltage. For example, using a very low bias current could lead to circuit stability problems. Moreover, accurately generating a very low bias current can be difficult. Therefore, it can be difficult to generate a low carrier frequency PWM from the ramped reference voltage by using a very low bias current.

Thus, one technique to achieve a low carrier frequency PWM signal is to use a very large reference capacitor (e.g., $C_{ref}$). However, using a large capacitor is undesirable. One reason a large capacitor is undesirable is the large die area required for a large capacitor. Alternatively, the reference capacitor could be located externally; however, this solution undesirably requires an additional pin.

Figure 2:
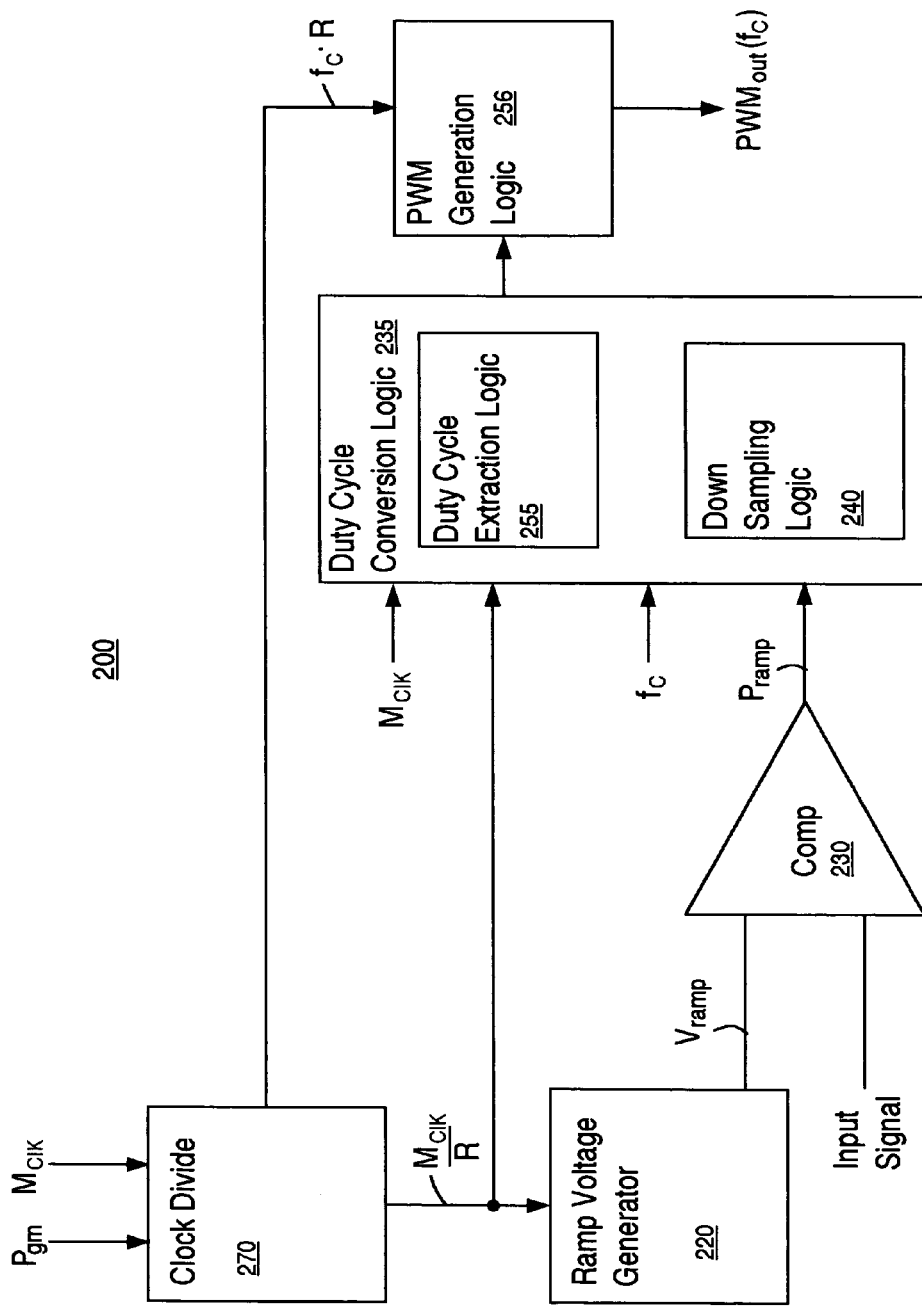
FIG. 2 is a block diagram of a circuit for generating a PWM signal at a desired carrier frequency, in accordance with an embodiment of the present invention.

FIG. 2 is a block diagram of a PWM circuit 200 that is able to generate a low carrier frequency pulse width modulator, in accordance with an embodiment of the present invention. Further, the circuit 200 is programmable to allow the carrier frequency $f_c$ of the output PWM signal $PWM_{out}$ to be programmed.

The PWM circuit 200 receives a master clock ($M_{clk}$), which is used for various elements in circuit 200. The master clock signal may be generated by an external crystal oscillator, an external clock source, a phase locked loop (PLL), etc. It will be appreciated that the master clock signal may be generated on-chip as a part of circuit 200.

The clock divide 270 receives the master clock $M_{clk}$ and divides it for the use of various components. Thus, the various components use clock signals that have a known relationship to the master clock $M_{clk}$. The clock divide 270 also optionally receives a clock program signal "Pgm" that indicates how the master clock $M_{clk}$ should be divided. This allows the carrier frequency $f_c$ of the output PWM signal $PWM_{out}$ to be programmed to a desired frequency.

The ramp voltage generator 220 inputs a clock $M_{clk}/R$ having a known relationship to the master clock $M_{clk}$ and generates a ramped voltage signal $V_{ramp}$ having the frequency of the clock $M_{clk}/R$. Thus, the frequency of the ramped voltage signal $V_{ramp}$ has a known relationship to the frequency of the master clock $M_{clk}$. For example, the ratio of the frequency of the master clock $M_{clk}$ to the frequency of ramped voltage signal $V_{ramp}$ is a known and controlled value. In some embodiments, the ratio is a power of two, although the present invention is not so limited.

The comparator 230 generates a temporary PWM signal $PWM_{temp}$ from its inputs of the ramped voltage signal $V_{ramp}$ and an input signal of interest. Thus, the carrier frequency of the temporary PWM signal $PWM_{temp}$ is at the frequency of the ramped voltage signal $V_{ramp}$. Therefore, the temporary PWM signal has a carrier frequency that is a known ratio to the frequency of the master clock $M_{clk}$. Furthermore, the temporary PWM signal has a duty cycle that comprises information about the input signal. For example, the duty cycle may be a function of the magnitude of the input signal. Thus, the temporary PWM signal comprises analog duty cycle information in that the width of its pulses may comprise information about the magnitude input signal. However, is not required that the analog duty cycle information related to the magnitude of the input signal.

It will be appreciated that the duty cycle of the temporary PWM signal $PWM_{temp}$ is not constant over time. Rather, the duty cycle may be different for different cycles of the temporary PWM signal $PWM_{temp}$. The input signal may be any signal of interest. Further, the input signal may be processed by, for example, filtering, rectifying, peak-detecting, etc.

The temporary PWM signal $PWM_{temp}$ comprises analog duty cycle information adapted to the frequency of the ramped voltage signal $M_{clk}/R$. In one embodiment, a duty cycle adapted to a given frequency can be any value from 0–100%. This allows the full pulse width to be used to store information. However, it is not required that the full pulse width be used to store information for a signal to have its duty cycle adapted to a given frequency. The conversion logic 235 generates digital duty cycle information that is adapted to the frequency $f_c$ of the final PWM signal $PWM_{out}$. The conversion logic 235 inputs the temporary PWM signal $PWM_{temp}$, a clock having the desired carrier frequency $f_c$, the master clock $M_{clk}$, and the clock $M_{clk}/R$ and outputs digital duty cycle information. The PWM generation logic 256 receives the digital duty cycle information and a clock whose frequency is "$f_c*R$" and outputs the final PWM signal. The PWM generation logic 256 may comprise a D/A converter.

Figure 3A:
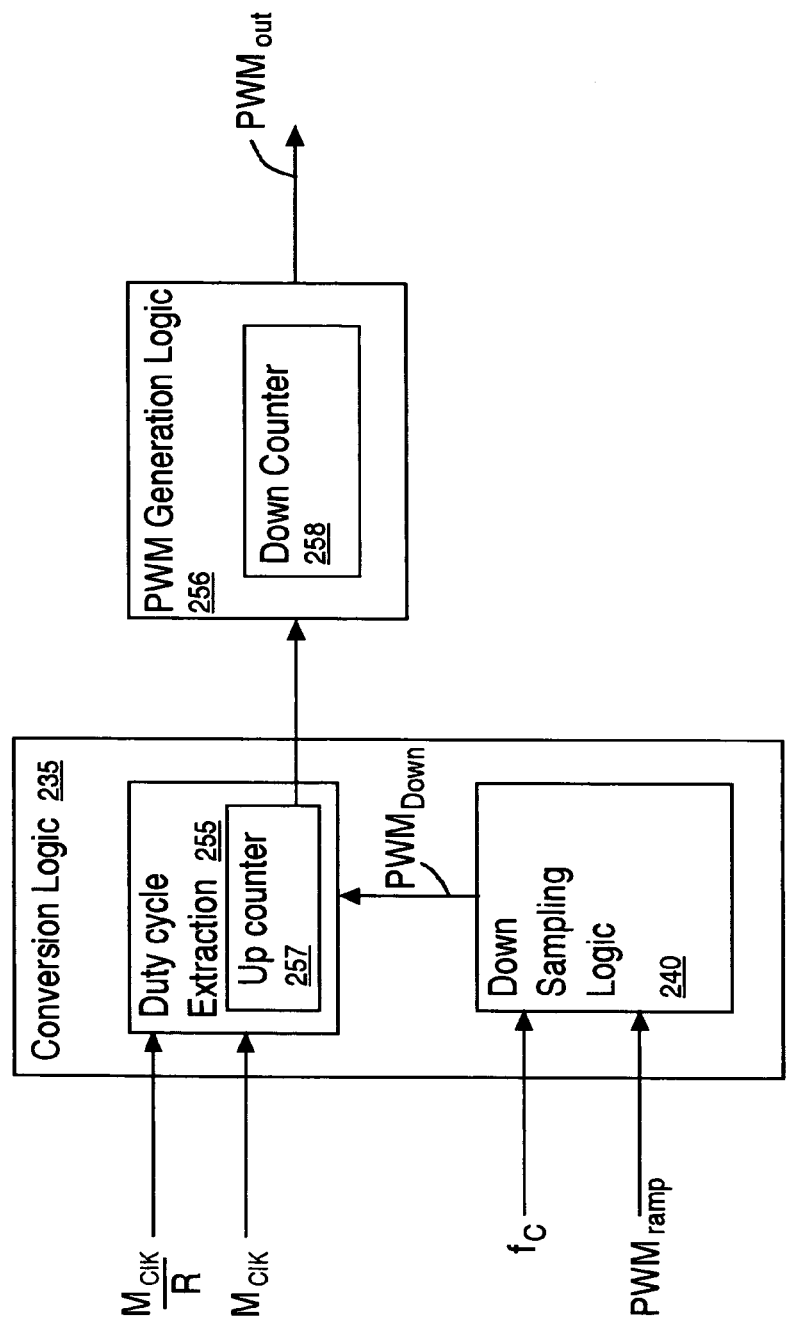
FIG. 3A duty cycle conversion logic depicts in accordance with an embodiment of the present invention.

The conversion logic 235 has down-sampling logic 240 and duty cycle extraction logic 255. The down sampling logic 240 may process the temporary PWM signal $PWM_{temp}$ prior to the duty cycle extraction logic 235 or afterwards. FIG. 3A depicts an embodiment of the duty cycle conversion logic 235. The down sampling logic 240 inputs the temporary PWM signal $PWM_{temp}$ and a sampling clock. The sampling clock has the frequency $f_c$ of the desired carrier frequency of the output PWM signal. Thus, the down-sampling logic 240 generates a down-sampled PWM signal $PWM_{down}$ at a down-sampled frequency from the temporary PWM signal $PWM_{temp}$. The down-sampled frequency is the desired carrier frequency $f_c$ of the final PWM signal. The down sampling may be implemented by logic that passes portions of the temporary PWM signal, while blocking other portions.

The conversion logic 235 also has duty cycle extraction logic 255. The duty cycle extraction logic 255 inputs the down-sampled signal $PWM_{down}$ from down sampling 240. The duty cycle extraction logic 255 also receives the master clock $M_{clk}$ and the clock $M_{clk}/R$ that was input to the ramp voltage generator 220. The duty cycle extraction logic 255 outputs digital duty cycle information.

In this embodiment, the duty cycle converter 235 has an A/D converter (e.g., up counter 257) coupled to the down-sampling logic 240. The A/D converter converts the analog duty cycle information of the down-sampled PWM signal $PWM_{down}$ into digital data. For example, the counter 257 uses the master clock $M_{clk}$ to count to determine the width of each pulse (whose width is determined by the clock $M_{clk}/R$) in the down-sampled PWM signal. It is not required that the A/D be implemented with a counter.

Figure 4:
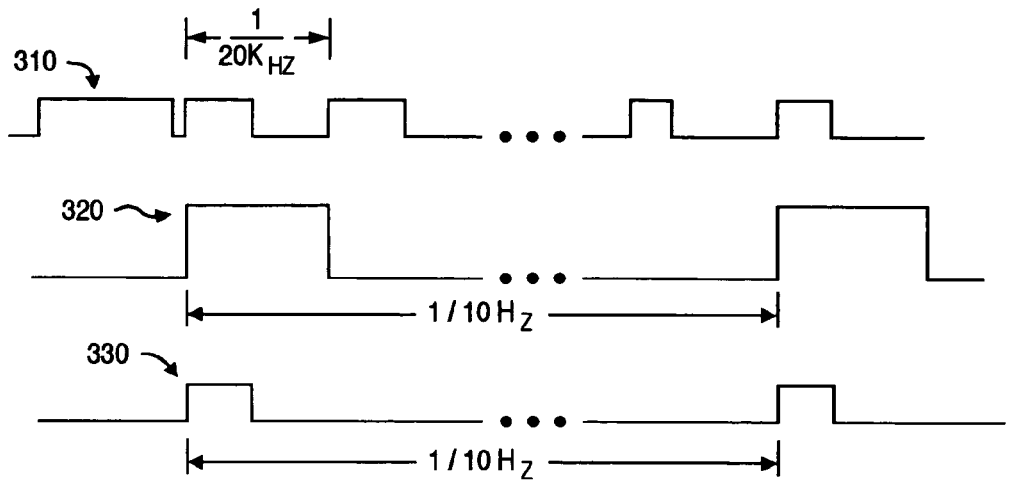
FIG. 4 is a diagram illustrating down sampling a PWM signal, in accordance with an embodiment of the present invention.

FIG. 4 provides an illustration of down sampling a PWM signal with exemplary frequencies and duty cycles, in accordance with an embodiment of the present invention. Referring to FIG. 4, a temporary PWM signal 310 with a carrier frequency of 20 kHz is sampled by a 10 Hz sampling clock 320 to produce down-sampled PWM signal 330. The high time of sampling clock 320 can be equal to one period or multiple periods of temporary PWM signal 310. Note that the carrier frequency of the down-sampled PWM signal 330 is equal to the frequency of the sampling clock. However, the width of the pulses in the down-sampled PWM signal 330 are the same as the corresponding pulses in the temporary PWM signal 310. Therefore, while information stored in the duty cycle of the temporary PWM signal 310 is passed through to the down-sampled PWM signal 330, the duty cycle of the down-sampled PWM signal 330 should be adjusted to correctly convey the information. In other words, the duty cycle should be adapted to the down sampled frequency. For example, the widths of the pulses in the down-sampled PWM signal 330 should be made wider to account for the reduction in the carrier frequency from 20 KHz to 10 Hz.

Referring still to FIG. 4, in the event that the period of the sampling clock 320 is equal to multiple periods of the temporary PWM signal 310, the down-sampled PWM signal 330 can be averaged prior to making its resultant period wider to take into account the frequency reduction due to the down-sampling. The averaging can be implemented by, for example, an A/D counter.

Figure 3B:
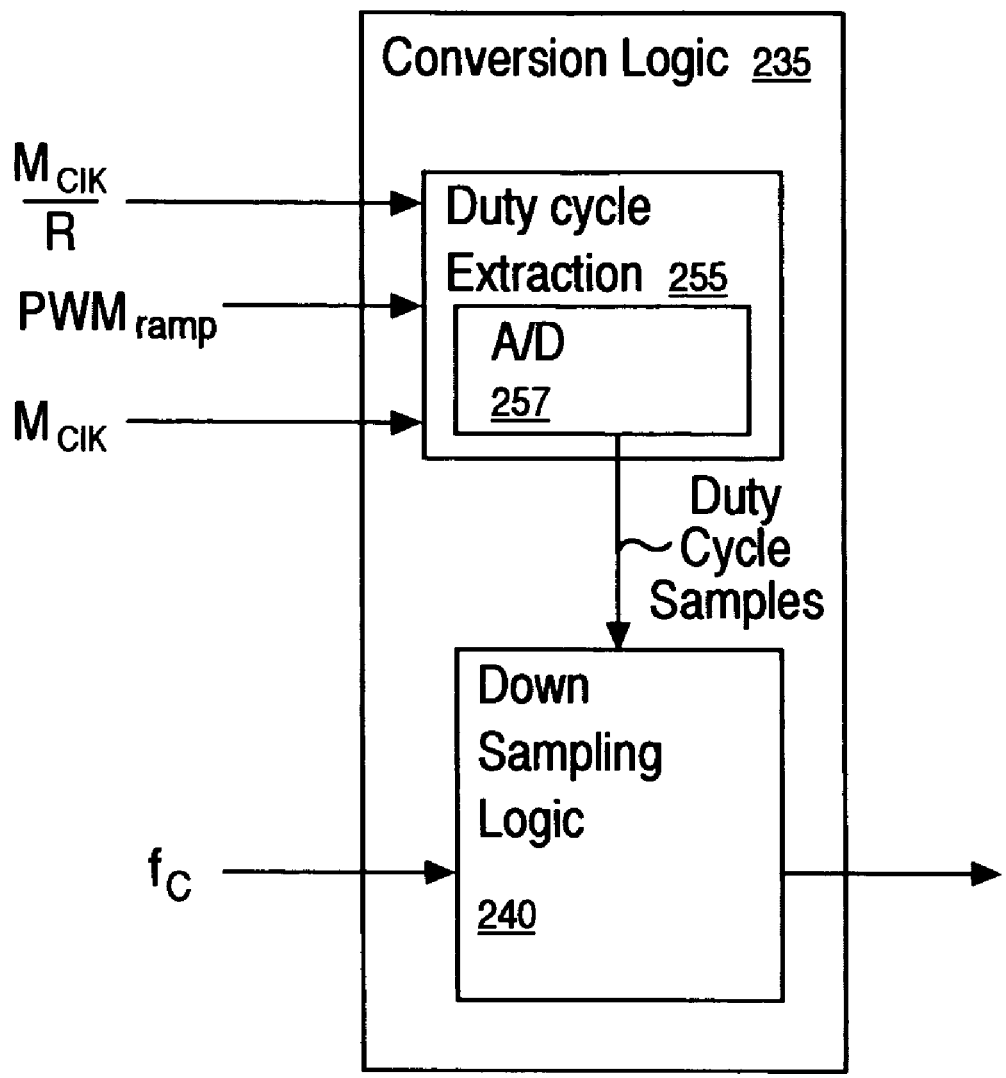
FIG. 3B is a block diagram of duty cycle conversion logic in which the duty cycle extraction logic first extracts temporary digital duty cycle samples from pulses of a temporary PWM signal in accordance with an embodiment of the present invention.

In another embodiment, the duty cycle extraction is performed prior to the down sampling. FIG. 3B is a block diagram of an embodiment of the duty cycle conversion logic 235 in which the duty cycle extraction logic 255 first extracts temporary digital duty cycle samples from pulses of the temporary PWM signal $PWM_{TEMP}$. This may result in more samples than are required for the frequency of the final PWM signal. At this point the temporary digital duty cycle information is adapted for the frequency of the ramped voltage reference signal. Then the down-sampling logic 240 processes this digital duty cycle information to adapt it for the carrier frequency of the output PWM signal. For example, the down-sampling logic 240 may average the digital duty cycle information to effectively down-sample the digital duty cycle information. However, the down sampling is not limited to averaging. There may be greater latency with this embodiment that the embodiment that first down-samples and then extracts the digital duty cycle information from the down-sampled signal.

Referring again to FIG. 2, the PWM generation logic 256 outputs the final PWM signal $PWM_{out}$ signal based on the digital duty cycle information adapted for the down-sampled frequency. Furthermore, the PWM generation logic 256 access a clock running at the carrier frequency $f_c$ of the PWM signal times the ratio (R) of the master clock frequency $M_{clk}$ to the frequency of the clock into the ramp voltage reference $M_{clk}/R$. In other words, this clock has a frequency of "$f_c*R$", where $f_c$ is the carrier frequency of the final PWM signal and "R" is the factor by which the master clock $M_{clk}$ was divided to generate the clock for the ramp voltage generator 220.

The PWM generation logic 256 may be implemented by a digital-to-analog converter (D/A) that receives the digital duty cycle information from the duty cycle conversion logic 235. The D/A can be implemented by counting down for the number of counts in the digital duty cycle information. For example, in the embodiment in FIG. 3A a down counter 258 is used. So long as the count is non-zero, the D/A outputs a "high" signal for the final PWM signal $PWM_{out}$. When the count hits zero, the D/A outputs a "low" signal for the final PWM signal.

Figure 5:
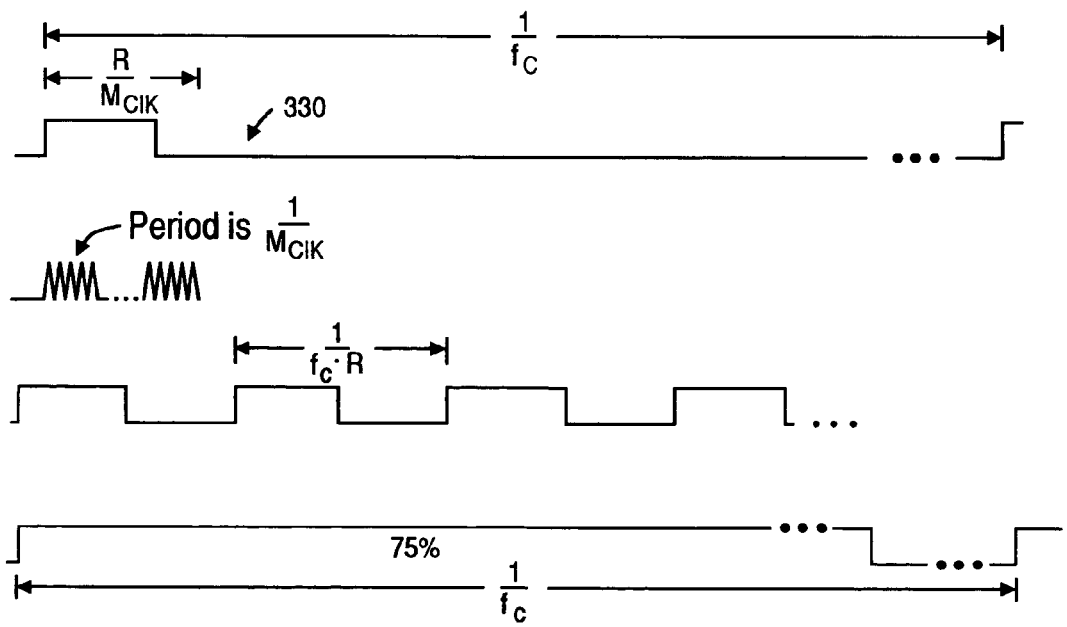
FIG. 5 is diagram illustrating converting duty cycle information that is adapted for one frequency such that it is adapted for another frequency, in accordance with an embodiment of the present invention.

FIG. 5 is diagram illustrating of adapting the duty cycle of the temporary PWM signal 330 for the frequency of the final PWM signal, in accordance with an embodiment of the present invention. In other words, the final PWM signal is generated with the widths of its pulses adapted such that the duty cycle is the correct percentage of the period of the final PWM signal.

The waveforms in FIG. 5 are exemplary. For convenience of explanation, the duty cycle of the depicted pulse of the temporary PWM 330 would be 75% if the period were "$R/M_{clk}$". Recall that "$R/M_{clk}$" is the period of the temporary PWM signal output by the comparator 230. However, the period of the down-sampled PWM signal 330 is "$1/f_c$", where $f_c$ is the carrier frequency of the final PWM signal. Thus, the duty cycle of the temporary PWM signal 330 is not adapted to the carrier frequency $f_c$.

The master clock $M_{clk}$ is used to convert analog duty cycle information of the temporary PWM signal 330 to digital data. For example, the master clock $M_{clk}$ is used to count the width of the pulse in the exemplary PWM signal 330. For example, an up-counter is incremented for each clock cycle of the master clock. Thus, for example, if the master clock were divided by 32 to create the ramped reference voltage (e.g., "R" is 32), then there would be 24 counts given the exemplary 75% duty cycle.

This count is input to the PWM generation logic (256, FIG. 2) along with the clock with frequency of "$f_c*R$" to generate the final PWM signal. The PWM generation logic 256 counts down for a number of pulses specified by the count parameter. In this embodiment, the latency may be as low as one clock cycle of the master clock $M_{clk}$.

As previously discussed, the carrier frequency $f_c$ of the final PWM signal is programmable. In one embodiment, to adjust the carrier frequency $f_c$, docks input to the duty cycle conversion logic 235 and the PWM generation logic 256 are adjusted. For example, a value (e.g., "pgm") may be sent to the clock divide circuit 270. The clock divide circuit adjusts the frequency of the clock with frequency "$f_c*R$" that is input to the PWM generation logic 256, and the sampling clock with frequency $f_c$ that is input to the duty cycle conversion logic 235. It is not required that the value "R" be adjusted.

Figure 6:
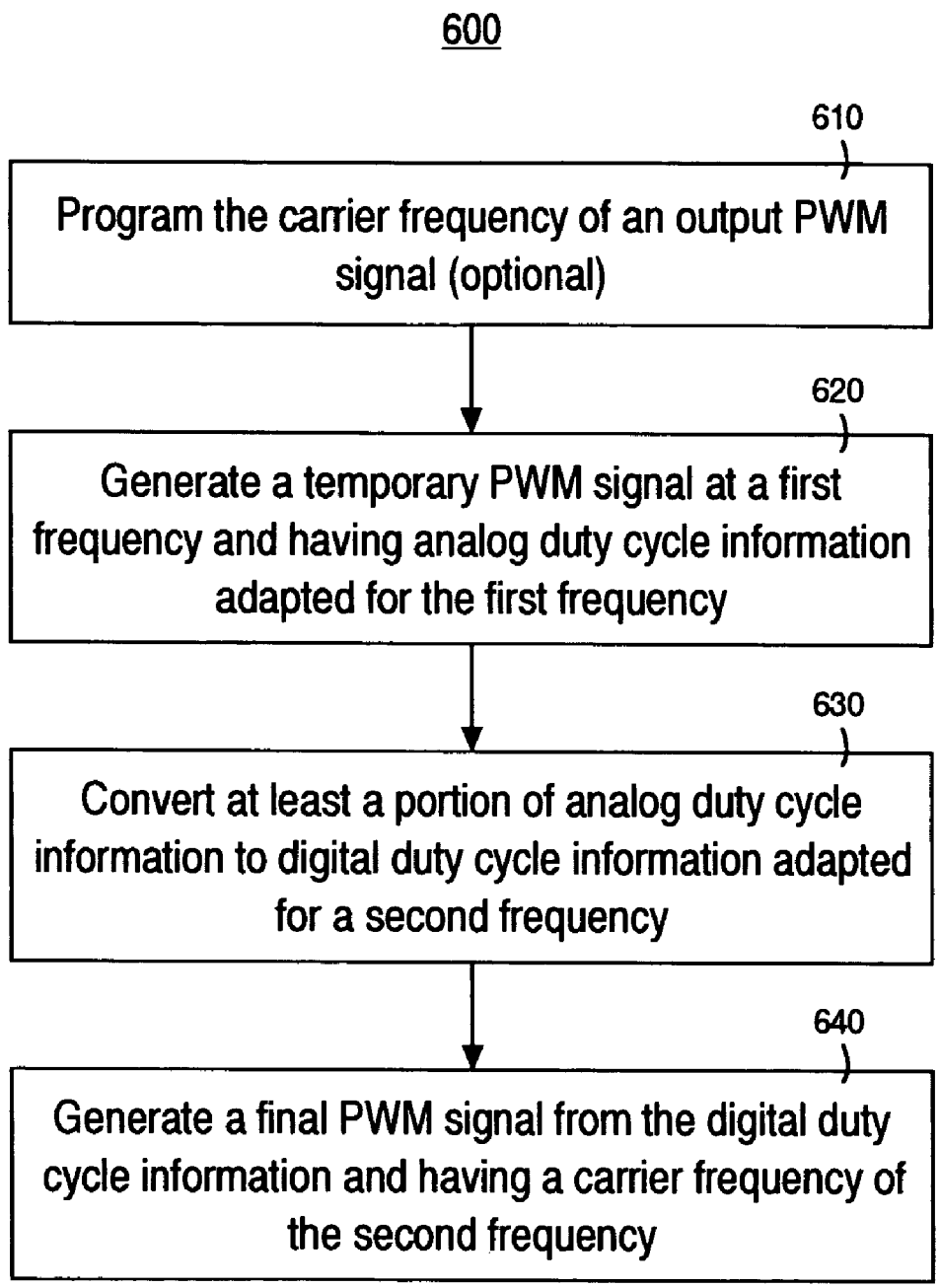
FIG. 6 is flowchart illustrating steps of a process of generating a PWM signal, in accordance with an embodiment of the present invention.

FIG. 6 is a flowchart illustrating steps of a process for generating a PWM signal, in accordance with an embodiment of the present invention. Step 610 is an optional step of programming the carrier frequency of an output PWM signal. The programming may include programming a clock rate used in down-sampling a temporary PWM signal in step 620. Furthermore, a clock rate used in generating the final PWM signal from the digital duty cycle information may be programmed in step 640.

Step 620 is generating a temporary PWM signal at a first frequency. The temporary PWM signal has analog duty cycle information adapted for the first frequency. Step 620 may include generating a fixed ramp reference voltage at a first frequency. The first frequency has a pre-determined relationship to a master clock frequency. For example, the pre-determined relationship is a ratio of the first frequency to the master clock frequency.

Step 630 is converting at least a portion of the analog duty cycle information to digital duty cycle information adapted for a second frequency. The second frequency is the carrier frequency of the output PWM signal. Step 630 may comprise down sampling the temporary PWM signal to produce a down-sampled PWM signal at the second frequency. Further, step 630 may comprise extracting the digital duty cycle information from pulses of the down-sampled PWM signal.

Alternatively, step 630 may comprise extracting temporary digital duty cycle information from pulses of the temporary PWM signal. The temporary digital duty cycle information is adapted for the first frequency. Step 630 further includes converting the temporary digital duty cycle information to the digital duty cycle information adapted for the second frequency, in this alternative sequence.

Step 640 is generating a final PWM signal from the digital duty cycle information. Step 640 may include converting the digital duty cycle information to widths of pulses of the final PWM. The final PWM has a carrier frequency of the second frequency.

Figure 7A:
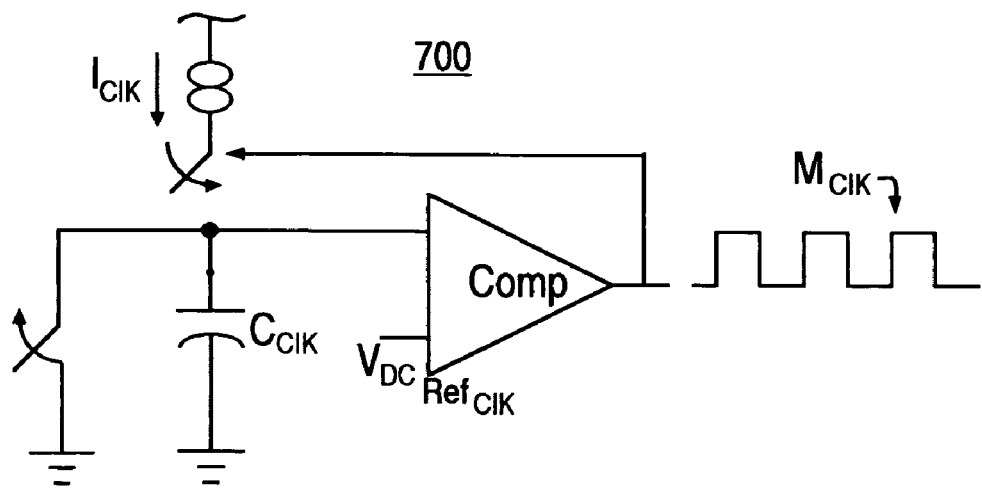
FIG. 7A illustrates an exemplary circuit for generating a master clock, in accordance with one embodiment of the present invention.

FIG. 7A illustrates an exemplary circuit 700 for generating a master clock $M_{clk}$, in accordance with one embodiment of the present invention. The circuit 700 of FIG. 7A comprises a comparator with inputs of voltage reference ($V_{DC\_ref\_clk}$) and a bias current ($I_{clk}$) and a capacitor ($C_{clk}$). The output of the comparator controls the switch coupled to the bias current $I_{clk}$.

Figure 7B:
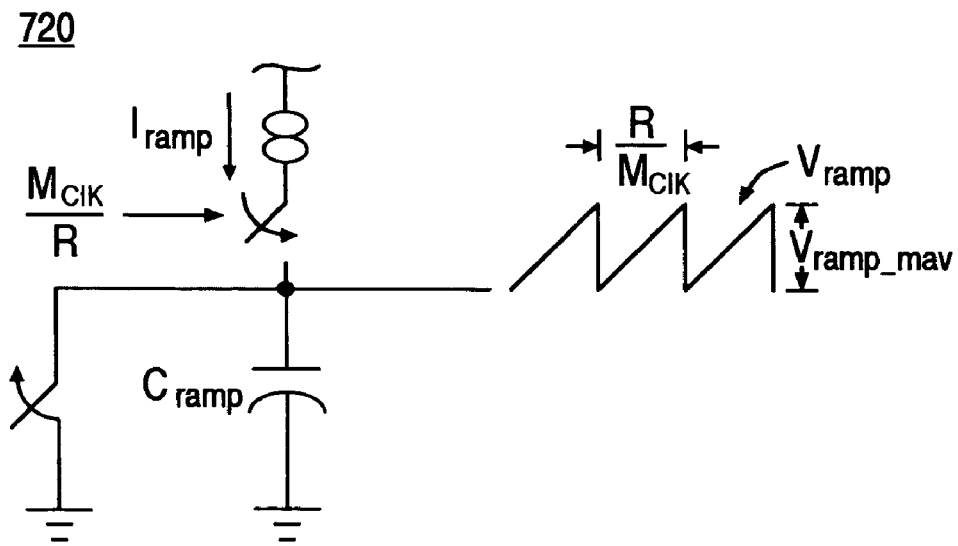
FIG. 7B illustrates an exemplary circuit for generating a ramped voltage, in accordance with one embodiment of the present invention.

FIG. 7B illustrates an exemplary circuit 720 for generating a ramped voltage, in accordance with one embodiment of the present invention. The frequency of the ramped voltage $V_{ramo}$ is controlled by the clock input $M_{clk}/R$. The clock $M_{clk}/R$ may be derived from the clock signal $M_{clk}$ generated by circuit 700 of FIG. 7A. For example the master clock $M_{clk}$ may be divided down by a series of flip-flops.

The circuit 720 of FIG. 7B comprises a bias current ($I_{ramp}$) coupled to a capacitor ($C_{ramp}$) via a switch. The circuit receives a clock signal $M_{clk}/R$, which is used to control the switch between the bias current $I_{ramp}$ and the capacitor. The output $V_{ramp}$ is taken from the capacitor $C_{ramp}$. The peak voltage value of $V_{ramp}$ is defined as $V_{ramp\_max}$. In one embodiment, $V_{ramp\_max}$ is $V_{dd}/2$, where $V_{dd}$ is depicted in FIG. 7D and included in Equation 5 herein.

Figure 7C:
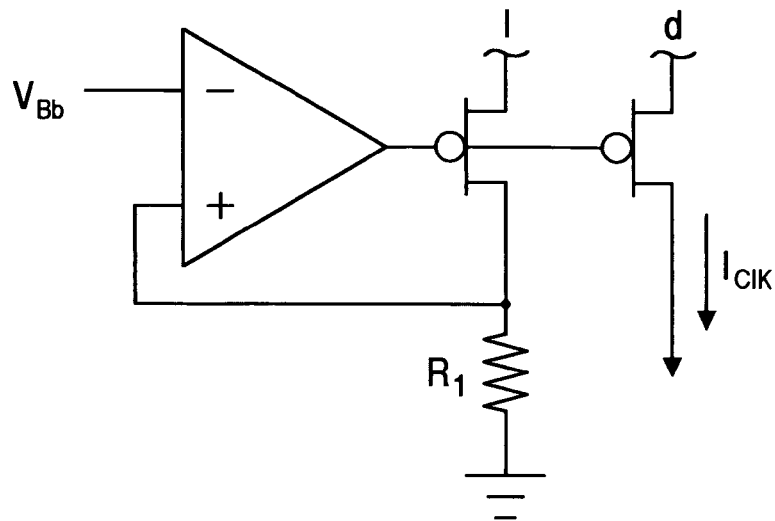
FIG. 7C illustrates an exemplary circuit for generating a bias current for the master clock circuit of FIG. 7A.

FIG. 7C illustrates an exemplary circuit 760 for generating a bias current $I_{clk}$ for the master clock circuit 700 of FIG. 7A, in accordance with one embodiment of the present invention. FIG. 7D illustrates an exemplary circuit 780 for generating a bias current $I_{ramp}$ for the ramp voltage reference circuit 720 of FIG. 7B, in accordance with one embodiment of the present invention.

In FIG. 7C, an operational amplifier has its output coupled to the gate of a current mirror, which supplies the bias current ($I_{clk}$) for the master clock circuit 700. The inverting input of the op-amp is coupled to a reference voltage ($V_{BG}$) and the non-inverting input is coupled to a resistor ($R_1$). The ratio of the transistors in the current mirror is 1:d.

Figure 7D:
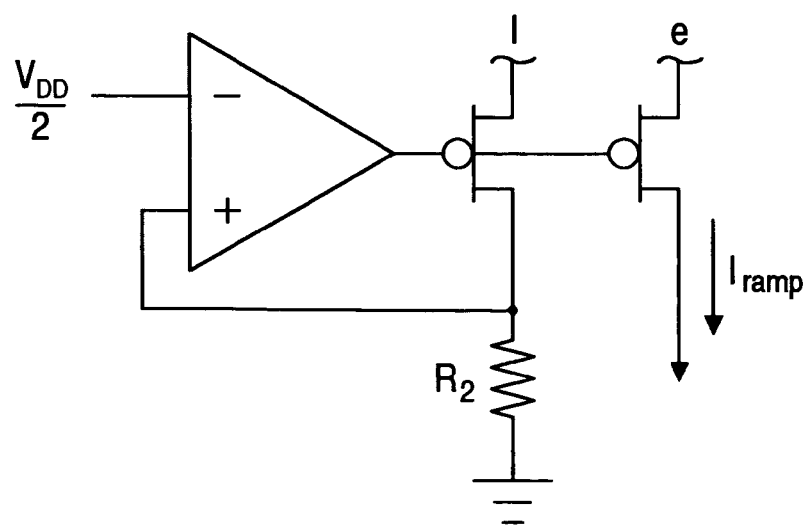
FIG. 7D illustrates an exemplary circuit for generating a bias current for the ramp voltage reference circuit of FIG. 7B, in accordance with one embodiment of the present invention.

In FIG. 7D, an operational amplifier has its output coupled to the gate of a current mirror, which supplies the bias current ($I_{ramp}$) for the ramp voltage reference circuit 720. The inverting input of the op-amp is coupled to a reference voltage ($V_{dd/2}$) and the non-inverting input is coupled to a resistor ($R_2$). The ratio of the transistors in the current mirror is 1:e.

Referring to FIGS. 7A and 7C, the period ($t_{clk}$) of the master clock $M_{clk}$ will be given by Equation 2 and Equation 3.

$$t_{clk} = C_{clk} * V_{clk}/I_{clk} \qquad \text{Eq. 2}$$

$$C_{clk} * V_{clk}/I_{clk} = C_{clk} * V_{BG}/[(d)(V_{BG}/R_1)] \qquad \text{Eq. 3}$$

Referring to FIGS. 7B and 7D, the period ($t_{ramp}$) of the ramp voltage reference $V_{ramp}$ will be given by Equation 4 and Equation 5.

$$t_{ramp} = C_{ramp} * V_{rmap\_max}/I_{ramp} \qquad \text{Eq. 4}$$

$$C_{ramp} * V_{rmap\_max}/I_{ramp} = [C_{ramp} * V_{dd}/2]/[(e)(V_{dd}/2)/R_2)] \qquad \text{Eq. 5}$$

Because the period of the ramp voltage reference ($t_{ramp}$) is "R" times the period of the master clock signal ($t_{clk}$), then equation 6 follows from Equations 4 and 5.

$$C_{ramp} * R_2/e = (C_{clk} * R_1/d) * R \qquad \text{Eq. 6}$$

The result is component matching of capacitors and resistors, which allows accurate control of $V_{ramp\_max}$ of the ramp voltage reference and control of relationship of the carrier frequency of the signals used in the circuit. The capacitors may be double polysilicon capacitors and the resistors may be high resistive polysilicon resistors.

Therefore, it will be seen that embodiments of the present invention provide a method and circuit for a PWM signal generator. Embodiments of the present invention provide for programming the carrier frequency of the PWM output signal. Embodiments of the present invention do not require a large capacitor to generate a low carrier frequency PWM signal. Embodiments of the present invention are compatible with and can be fabricated economically with existing semiconductor fabrication techniques.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of generating a pulse-width modulated (PWM) signal for a PWM circuit, comprising:

generating a temporary PWM signal at a first frequency and comprising analog duty cycle information adapted for said first frequency;

converting at least a portion of said analog duty cycle information to digital duty cycle information adapted for a second frequency; and generating a final PWM signal with a PWM generation logic from said digital duty cycle information, said final PWM signal's carrier frequency is the same as said second frequency.

2. The method of claim 1, further comprising:

accessing a master clock of said PWM circuit having a master clock frequency; and generating a first clock at said first frequency, wherein said first frequency has a user specified relationship to said master clock frequency; and wherein said generating said temporary PWM signal is based on said first clock and an input signal.

3. The method of claim 2, wherein said generating said temporary PWM signal comprises generating a fixed ramp reference voltage at said first frequency.

4. The method of claim 2, wherein said pre-determined relationship is a ratio of said first frequency to said master clock frequency.

5. The method of claim 2, wherein said converting comprises:

down-sampling said temporary PWM signal to produce a down-sampled PWM signal at said second frequency; and extracting said digital duty cycle information from pulses of said down-sampled PWM signal.

6. The method of claim 5, wherein said extracting comprises applying said master clock to said down-sampled PWM signal.

7. The method of claim 1, wherein said converting comprises:

down-sampling said temporary PWM signal to produce a down-sampled PWM signal at said second frequency; and extracting said digital duty cycle information from pulses of said down-sampled PWM signal.

8. The method of claim 7, further comprising programming the carrier frequency of said final PWM signal.

9. The method of claim 8, wherein said programming comprises:

programming a clock rate used in said down-sampling said temporary PWM signal; and programming a clock rate used in said generating said final PWM signal from said digital duty cycle information.

10. The method of claim 1, wherein said converting comprises:

extracting temporary digital duty cycle information from pulses of said temporary PWM signal, wherein said temporary digital duty cycle information is adapted for said first frequency, and wherein said adapted temporary digital duty cycle information has its associated pulse widths adjusted for said first frequency; and converting said temporary digital duty cycle information to said digital duty cycle information adapted for said second frequency, wherein said adapted temporary digital duty cycle information has its associated pulse widths adjusted for said second frequency.

11. A circuit for generating pulse-width modulated signal, comprising:

temporary pulse-width modulated (PWM) generation logic that generates a temporary PWM signal comprising analog duty cycle information adapted for a first frequency;

conversion logic coupled to said temporary PWM generation logic and that converts at least a portion of said analog duty cycle information to digital duty cycle information adapted for a second frequency; and final PWM generation logic coupled to said conversion logic and that generates a final PWM signal from said digital duty cycle information, said final PWM having a carrier frequency of said second frequency.

12. The circuit of claim 11, wherein said conversion logic comprises:

down-sampling logic that samples said temporary PWM signal to produce a down-sampled PWM signal at said second frequency; and duty cycle extraction logic coupled to said down-sampling logic and that extracts said digital duty cycle information from pulses of said down-sampled PWM signal.

13. The circuit of claim 12, wherein said duty cycle extraction logic comprises an analog-to-digital converter.

14. The circuit of claim 13, wherein said final PWM generation logic conversion logic comprises a digital-to-analog converter.

15. The circuit of claim 11, wherein said temporary PWM generation logic comprises a comparator and a ramp voltage generator.

16. The circuit of claim 11, further comprising a clock divide circuit that accesses a master clock of said circuit and is operable to output to said temporary PWM generation logic a generation clock at said first frequency and a carrier frequency clock having said second frequency to said final PWM generation logic and said conversion logic.

17. The circuit of claim 16, wherein said temporary PWM generation logic is operable to generate said temporary PWM signal based on said generation clock and an input signal.

18. The circuit of claim 16, wherein said conversion logic accesses said master clock and is operable to convert said portion of said analog duty cycle information by applying said master clock to said temporary PWM signal.

19. The circuit of claim 16, wherein said final PWM generation logic is operable to generate said final PWM signal based on said carrier frequency clock and said digital duty cycle information.

20. A circuit for generating a pulse-width modulated signal, comprising:

a ramp voltage generator that is operable to generate a ramped voltage having a first frequency that has a user-specified relationship to a master clock;

a comparator having a first input coupled to said ramp voltage generator output, a second input that receives an input signal, and an output that outputs a temporary pulse width modulated (PWM) signal comprising analog duty cycle information;

down-sampling logic coupled to said comparator output and that selects portions of said analog duty cycle information; and duty cycle conversion logic coupled to said down-sampling logic and that converts said selected portions of said analog duty cycle information cycle to digital duty cycle information adapted for said down-sampled frequency; and PWM generation logic coupled to said conversion logic and that generates a final PWM signal from said digital duty cycle information, said final PWM having a carrier frequency of said down-sampled frequency.

21. The circuit of claim 20, further comprising a clock divide circuit that accesses a master clock of said circuit and outputs first and second clocks having respective first and second user-specified relationships to said master clock.

22. The circuit of claim 21, wherein said ramp voltage generator is coupled to said clock divide circuit and inputs said first clock of said circuit.

23. The circuit of claim 22, wherein said duty cycle conversion logic inputs said master clock of said circuit.

24. The circuit of claim 20, wherein said PWM generation logic is coupled to said clock divide circuit and inputs said second clock of said circuit.

25. The circuit of claim 24, wherein said down-sampling logic is coupled to said clock divide circuit and inputs said clock having said second pre-determined relationship to said master clock of said circuit.

26. The circuit of claim 21, further comprising a master clock generation circuit that generates said master clock and wherein said ramp voltage generator inputs said first clock of said circuit.

27. The circuit of claim 26, wherein said master clock generation circuit and said ramp voltage generator comprise matched capacitors, wherein said matched capacitors improve control of said ramp voltage reference.

28. The circuit of claim 27, wherein said master clock generation circuit and said ramp voltage generator comprise matched resistors, wherein said matched resistors improve control of said ramp voltage reference.

29. The circuit of claim 20, wherein duty cycle conversion logic comprises an analog-to-digital converter.

30. The circuit of claim 29, wherein said analog-to-digital converter comprises a counter.

31. The circuit of claim 20, wherein said wherein said PWM generation logic comprises a digital-to-analog converter.

32. The circuit of claim 31, wherein said digital-to-analog converter comprises a counter.

* * * * *